(12) United States Patent
Eda et al.

(10) Patent No.: US 10,887,416 B2
(45) Date of Patent: Jan. 5, 2021

(54) EFFICIENT HIGH AVAILABILITY AND STORAGE EFFICIENCY IN A MULTI-SITE OBJECT STORAGE ENVIRONMENT

(71) Applicant: International Business Machines Corporation, Armonk, NY (US)

(72) Inventors: Sasikanth Eda, Vijayawada (IN); Anbazhagan Mani, Bangalore (IN); Sandeep R. Patil, Pune (IN); Ramakrishna Vadla, Patacheru (IN)

(73) Assignee: International Business Machines Corporation, Armonk, NY (US)

( * ) Notice: Subject to any disclaimer, the term of this patent is extended or adjusted under 35 U.S.C. 154(b) by 72 days.

(21) Appl. No.: 15/972,421

(22) Filed: May 7, 2018

(65) Prior Publication Data
US 2019/0342418 A1    Nov. 7, 2019

(51) Int. Cl.
*H04L 29/08* (2006.01)
*H03M 13/15* (2006.01)

(52) U.S. Cl.
CPC ...... *H04L 67/2842* (2013.01); *H03M 13/154* (2013.01); *H04L 67/101* (2013.01); *H04L 67/1097* (2013.01)

(58) Field of Classification Search
None
See application file for complete search history.

(56) References Cited

U.S. PATENT DOCUMENTS

| 8,819,260 B2 | 8/2014 | Zuckerman et al. | |
| 2009/0157378 A1* | 6/2009 | Boldyrev | G06F 11/008 703/22 |
| 2011/0029840 A1* | 2/2011 | Ozzie | G06F 11/1004 714/763 |
| 2011/0055178 A1* | 3/2011 | Mark | G06F 3/0619 707/697 |

(Continued)

OTHER PUBLICATIONS

"IBM Cloud Object Storage System Features and Benefits," published Jul. 15, 2016 (Year: 2016)*

(Continued)

*Primary Examiner* — Scott B Christensen
(74) *Attorney, Agent, or Firm* — Stephen R. Tkacs; Stephen J. Walder, Jr.; Robert M. Sullivan

(57) ABSTRACT

A mechanism is provided in a data processing system comprising at least one processor and at least one memory, the at least one memory comprising instructions which are executed by the at least one processor and configure the processor to implement a proxy server for hybrid geo-dispersed erasure coding (EC). Responsive to receiving from an application server a request to write an object, the proxy server in a first storage site splits the object into a plurality of EC slices. The proxy server stores a first EC slice in a first storage device via a storage server local to the proxy server. The proxy server stores a plurality of remaining EC slices in a cache storage local to the proxy server. Responsive to determining that network access is available to disperse the plurality of slices among a plurality of geographically distributed storage sites, the proxy server copies (Continued)

the plurality of remaining EC slices to the plurality of geographically distributed storage sites using geo-dispersed erasure coding.

20 Claims, 10 Drawing Sheets

(56) References Cited

U.S. PATENT DOCUMENTS

| | | | |
|---|---|---|---|
| 2011/0055661 A1* | 3/2011 | Grube | G06F 11/1092 |
| | | | 714/763 |
| 2014/0129782 A1* | 5/2014 | Quinn | H04L 67/1097 |
| | | | 711/141 |
| 2017/0123728 A1 | 5/2017 | Rungta | |
| 2017/0153978 A1* | 6/2017 | Motwani | G06F 3/0644 |
| 2018/0349043 A1* | 12/2018 | Eda | G06F 3/0619 |

OTHER PUBLICATIONS

Laden, Guy et al., "Adaptive and Dynamic Funnel Replication in Clouds", ACM Digital Library, Newsletter, ACM SIGOPS Operating Systems Review, vol. 46, issue 1, Jan. 2012, pp. 40-46.

* cited by examiner

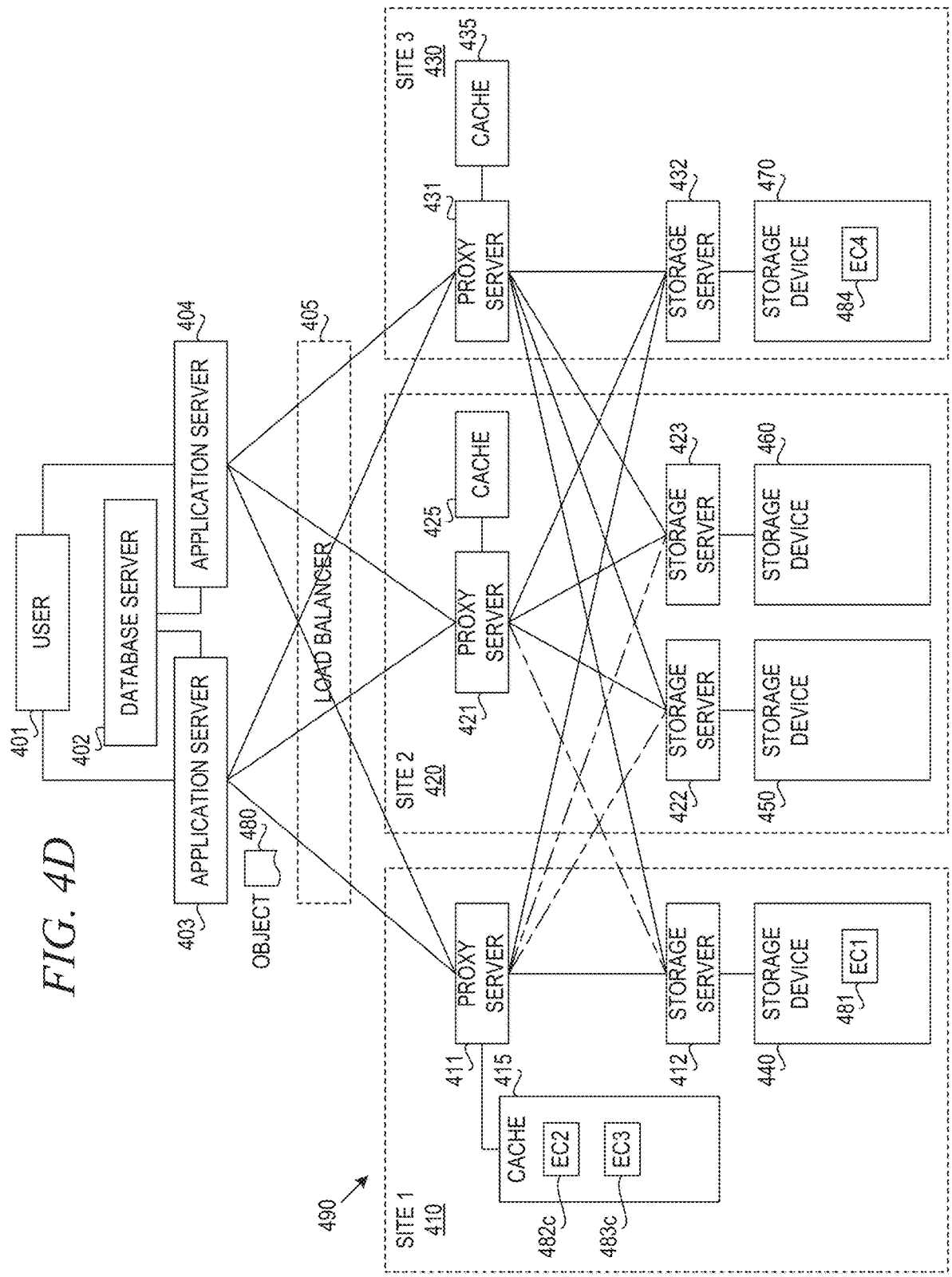

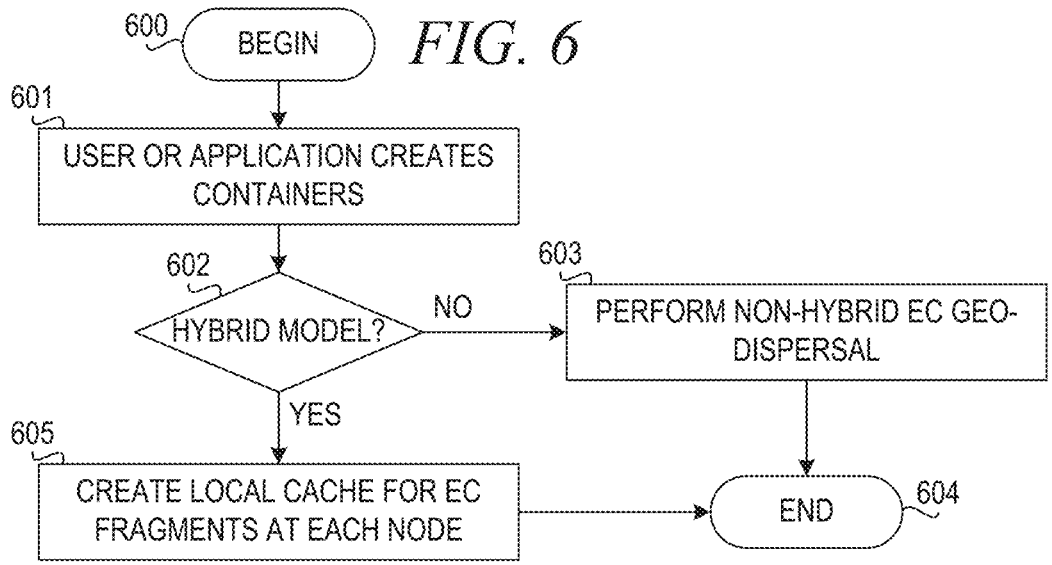
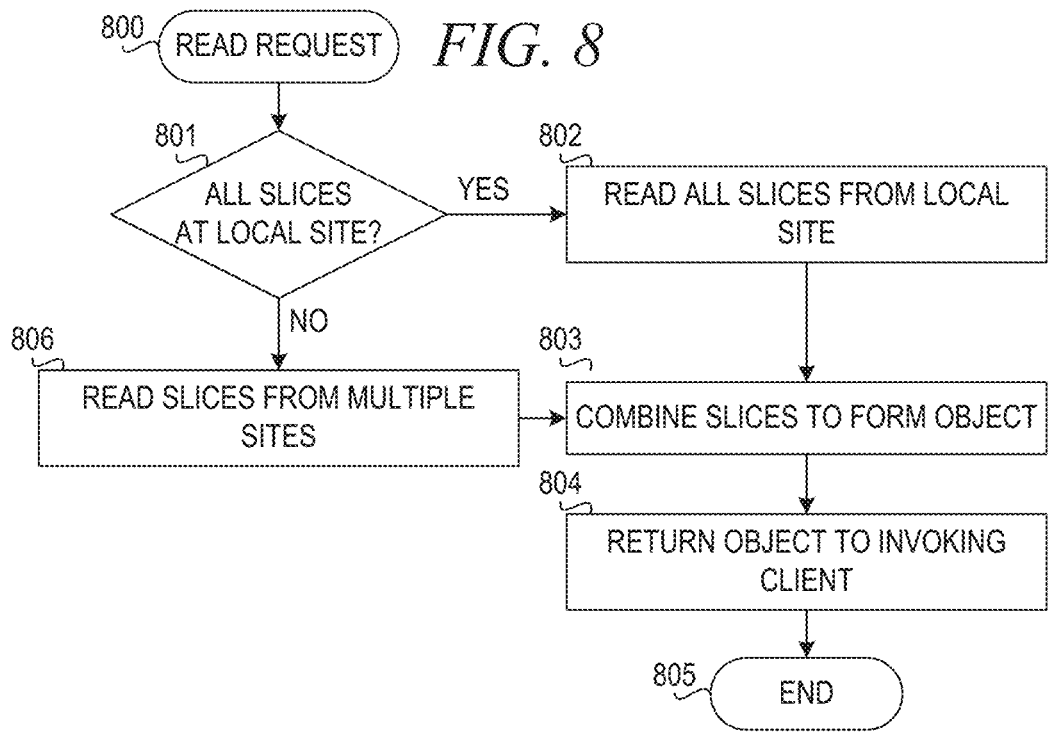

EFFICIENT HIGH AVAILABILITY AND STORAGE EFFICIENCY IN A MULTI-SITE OBJECT STORAGE ENVIRONMENT

BACKGROUND

The present application relates generally to an improved data processing apparatus and method and more specifically to mechanisms for efficient high availability and storage efficiency in a multi-site object storage environment.

Erasure coding (EC) is a method of data protection in which data is broken into fragments, expanded and encoded with redundant data pieces and stored across a set of different locations or storage media. The goal of erasure coding is to enable data that becomes corrupted at some point in the disk storage process to be reconstructed by using information about the data that's stored elsewhere in the array. Erasure codes are often used instead of traditional redundant array of independent disks (RAID) because of their ability to reduce the time and overhead required to reconstruct data. The drawback of erasure coding is that it can be more processor-intensive, and that can translate into increased latency. Erasure coding can be useful with large quantities of data and any applications or systems that need to tolerate failures, such as disk array systems, data grids, distributed storage applications, object stores and archival storage. One common current use case for erasure coding is object-based cloud storage.

Erasure coding creates a mathematical function to describe a set of numbers so they can be checked for accuracy and recovered if one is lost. Referred to as polynomial interpolation or oversampling, this is the key concept behind erasure codes. In mathematical terms, the protection offered by erasure coding can be represented in simple form by the following equation: n=k+m. The variable "k" is the original amount of data or symbols. The variable "m" stands for the extra or redundant symbols that are added to provide protection from failures. The variable "n" is the total number of symbols created after the erasure coding process. For instance, in a 10 of 16 configuration, or EC 10/16, six extra symbols (m) would be added to the 10 base symbols (k). The 16 data fragments (n) would be spread across 16 drives, nodes or geographic locations. The original the could be reconstructed from 10 verified fragments.

SUMMARY

This Summary is provided to introduce a selection of concepts in a simplified form that are further described herein in the Detailed Description. This Summary is not intended to identify key factors or essential features of the claimed subject matter, nor is it intended to be used to limit the scope of the claimed subject matter.

In one illustrative embodiment, a method is provided in a data processing system comprising at least one processor and at least one memory, the at least one memory comprising instructions which are executed by the at least one processor and configure the processor to implement a proxy server for hybrid geo-dispersed erasure coding (EC), The method comprises receiving from an application server a request to write an object and splitting, by the proxy server in a first storage site, the object into a plurality of EC slices. The method further comprises storing, by the proxy server, a first EC slice in a first storage device via a storage server local to the proxy server. The method further comprises storing, by the proxy server, a plurality of remaining EC slices in a cache storage local to the proxy server. The method further comprises responsive to the proxy server determining that network access is available to disperse the plurality of slices among a plurality of geographically distributed storage sites, copying the plurality of remaining EC slices to the plurality of geographically distributed storage sites using geo-dispersed erasure coding.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein:

FIGS. 4A-4E are block diagrams illustrating an erasure code supported object storage architecture in which aspects of the illustrative embodiments may be implemented;

FIG. 6 is a flowchart illustrating operation of a hybrid geo-dispersed erasure coding object service in accordance with an illustrative embodiment;

FIG. 8 is a flowchart illustrating operation of a hybrid geo-dispersed erasure coding object service for performing a read in accordance with an illustrative embodiment.

DETAILED DESCRIPTION

Figure 1:
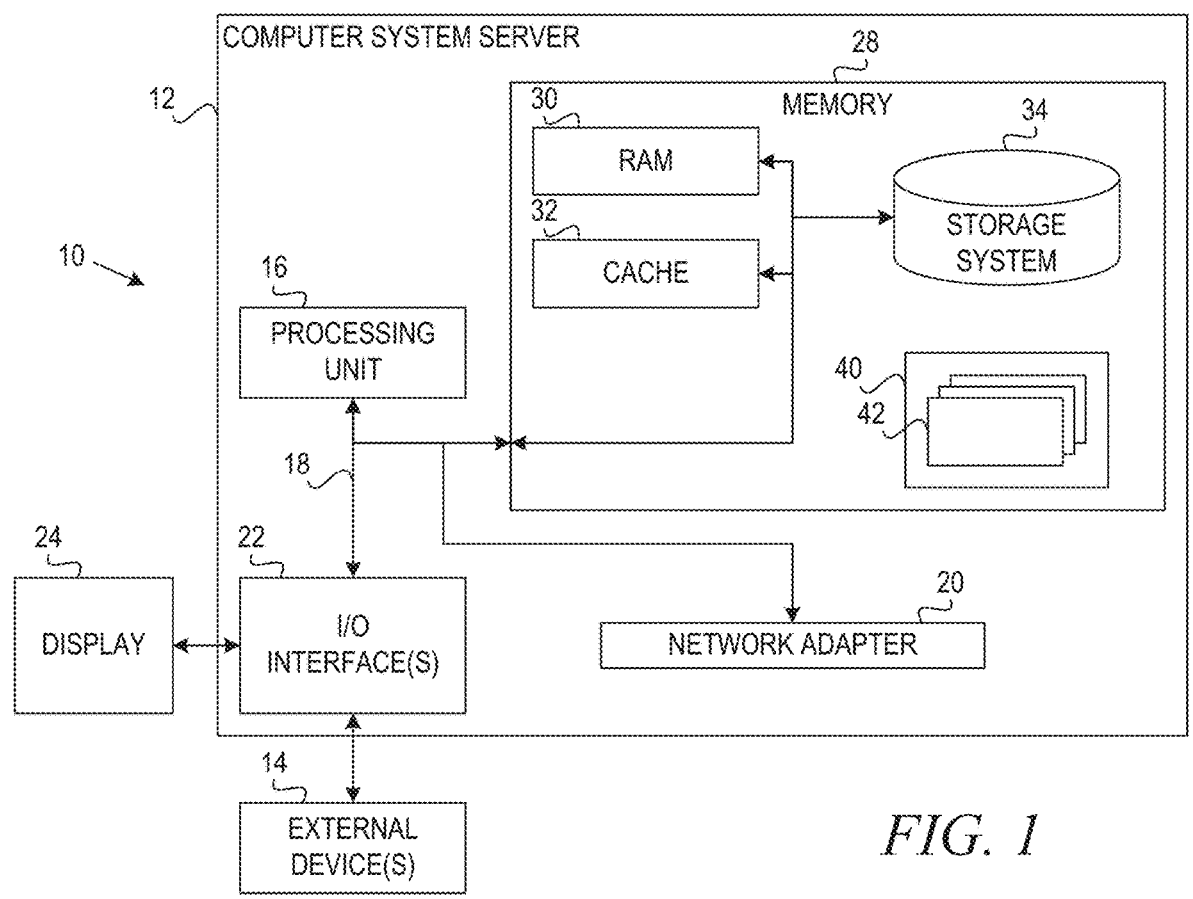
FIG. 1 depicts a cloud computing node according to an illustrative embodiment.

Advancements in coding theory have led to adoption of geo-dispersed erasure coding in object storage implementations. Software defined implementation of geo-dispersed erasure coding accepts incoming hypertext transmission protocol (HTTP) PUT requests, slices or fragments the data using the chosen erasure coding algorithm, and stores the fragments on multiple sites. When a site goes down, data can still be retrieved from other sites as long as thresholds are met.

Usage of geo-dispersed erasure coding results in very high storage efficiency when compared to traditional storage, which works using redundant array of independent disks (RAID) algorithms and replication. For example, storage efficiency with erasure coding on cloud object storage needs only 1.7 times the raw capacity versus 3.5 times on traditional storage. Each site is geographically distributed, and a wide area network (WAN) is required to connect the sites.

There are three key problems with current geo-dispersed erasure coding-based architecture and implementation. Taking a three-site architecture as an example, the problems are as follows:

1. In the multi-site architecture, all three sites must be connected via a very reliable network. If an object write (PUT operation) has to be committed, the writes of the fragments or slices on all of the three sites must succeed. If the network between the three sites is not reliable (for example, due to a temporary network outage), then the object writes will fail. In comparison, traditional replication models work better as they can withstand temporary network outages.

2. Even if the network is reliable between all three sites, the WAN latency between the geographically distributed sites does result in lower performance of object writes (note the PUT operation returns only after the object write is committed).

3. For every object read (GET operation), the slices must be read from all of the three sites, original data must be combined together, and then the object is sent to the client applications. This works well but involves higher network latency to get the threshold number of fragments from the sites. This causes performance problems, especially if the network latency (with WAN) can be higher at times.

Because WAN networks are unreliable, a solution is required to address the above problems. The illustrative embodiments provide a hybrid algorithm that dynamically adapts to network conditions on both object writes and reads.

Before beginning the discussion of the various aspects of the illustrative embodiments, it should first be appreciated that throughout this description the term "mechanism" will be used to refer to elements of the present invention that perform various operations, functions, and the like. A "mechanism," as the term is used herein, may be an implementation of the functions or aspects of the illustrative embodiments in the form of an apparatus, a procedure, or a computer program product. In the case of a procedure, the procedure is implemented by one or more devices, apparatus, computers, data processing systems, or the like. In the case of a computer program product, the logic represented by computer code or instructions embodied in or on the computer program product is executed by one or more hardware devices in order to implement the functionality or perform the operations associated with the specific "mechanism," Thus, the mechanisms described herein may be implemented as specialized hardware, software executing on general purpose hardware, software instructions stored on a medium such that the instructions are readily executable by specialized or general purpose hardware, a procedure or method for executing the functions, or a combination of any of the above.

The present description and claims may make use of the terms "a," "at least one of," and "one or more of" with regard to particular features and elements of the illustrative embodiments. It should be appreciated that these terms and phrases are intended to state that there is at least one of the particular feature or element present in the particular illustrative embodiment, but that more than one can also be present. That is, these terms/phrases are not intended to limit the description or claims to a single feature/element being present or require that a plurality of such features/elements be present. To the contrary, these terms/phrases only require at least a single feature/element with the possibility of a plurality of such features/elements within the scope of the description and claims.

In addition, it should be appreciated that the following description uses a plurality of various examples for various elements of the illustrative embodiments to further illustrate example implementations of the illustrative embodiments and to aid in the understanding of the mechanisms of the illustrative embodiments. These examples intended to be non-limiting and are not exhaustive of the various possibilities for implementing the mechanisms of the illustrative embodiments. It will be apparent to those of ordinary skill in the art in view of the present description that there are many other alternative implementations for these various elements that may be utilized in addition to, or in replacement of, the examples provided herein without departing from the spirit and scope of the present invention.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Object storage (also known as object-based storage) is a computer data storage architecture that manages data as objects, as opposed to other storage architectures like file systems which manage data as a file hierarchy and block storage which manages data as blocks within sectors and tracks. Each object typically includes the data itself, a variable amount of metadata, and a globally unique identifier. Object storage can be implemented at multiple levels, including the device level (object storage device), the system level, and the interface level. In each case, object storage seeks to enable capabilities not addressed by other storage architectures, like interfaces that can be directly programmable by the application, a namespace that can span multiple instances of physical hardware, and data management functions like data replication and data distribution at object-level granularity. Object storage is widely used in on-premises and public clouds.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 1, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
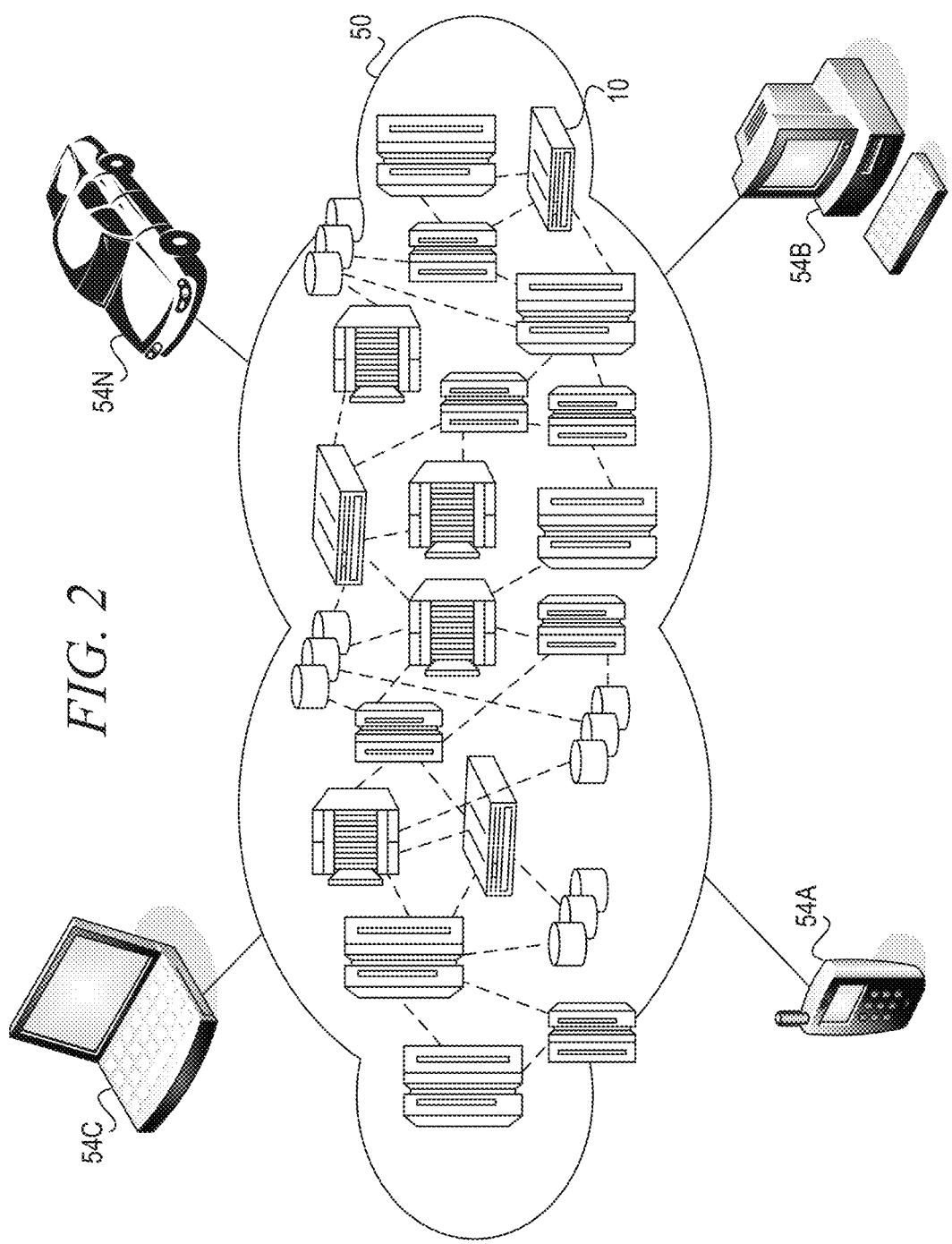
FIG. 2 depicts a cloud computing environment according an illustrative embodiment.

Referring now to FIG. 2, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and/or network addressable connection (e.g., using a web browser).

Figure 3:
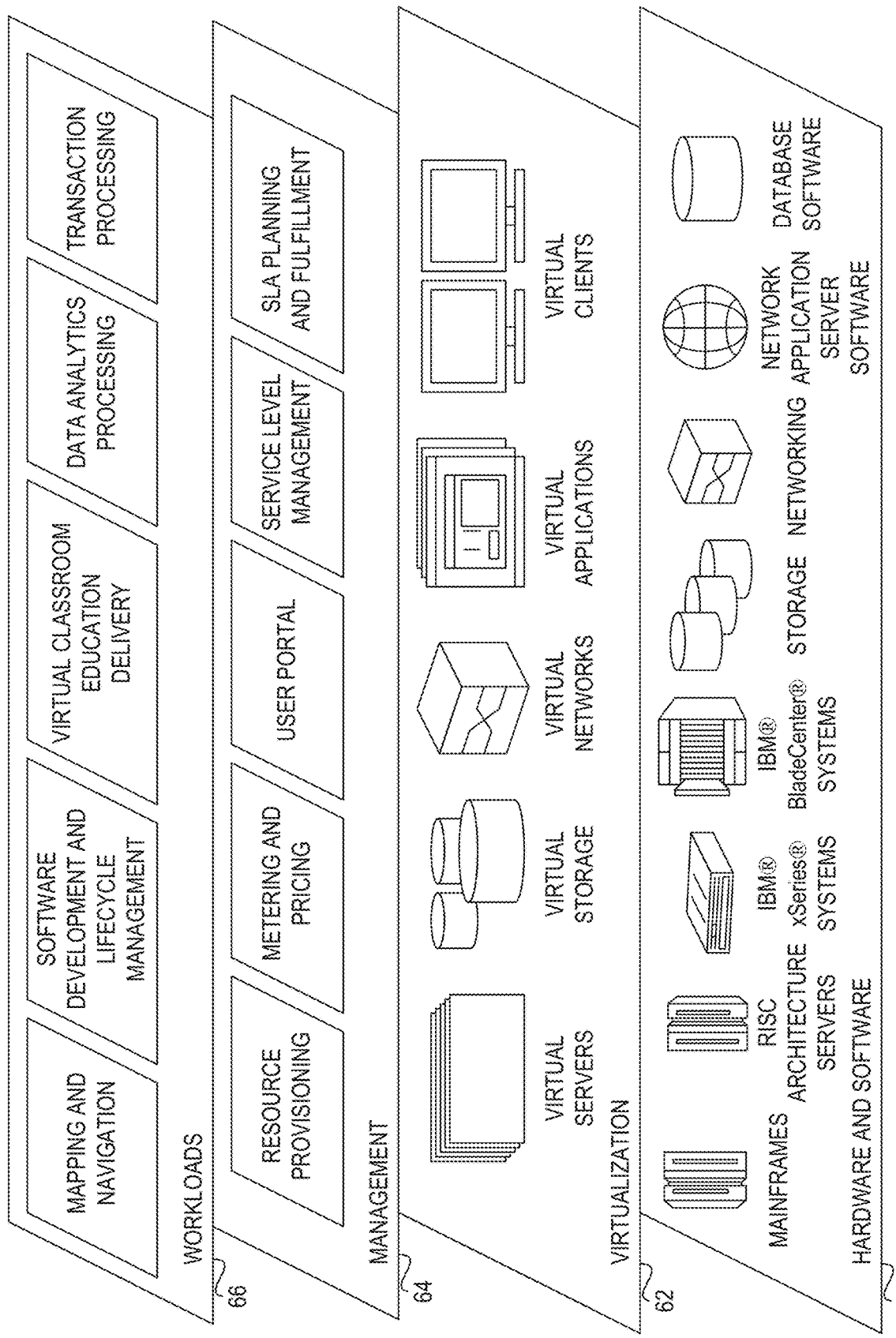
FIG. 3 depicts abstraction model ding to an illustrative embodiment.

Referring now to FIG. 3, a set of functional abstraction layers provided by cloud computing environment 50 (FIG. 2) is shown. It should be understood in advance that the components, layers, and functions shown in FIG. 3 are intended to be illustrative only and embodiments of the invention are not limited thereto. As depicted, the following layers and corresponding functions are provided:

Hardware and software layer 60 includes hardware and software components. Examples of hardware components include mainframes, in one example IBM® zSeries® systems; RISC (Reduced Instruction Set Computer) architecture based servers, in one example IBM pSeries® systems; IBM xSeries® systems; IBM BladeCenter® systems; storage devices; networks and networking components. Examples of software components include network application server software, in one example IBM WebSphere® application server software; and database software, in one example IBM DB2® database software, (IBM, zSeries, pSeries, xSeries, BladeCenter, WebSphere, and DB2 are trademarks of international Business Machines Corporation registered in many jurisdictions worldwide).

Virtualization layer 62 provides an abstraction layer from which the following examples of virtual entities may be provided: virtual servers; virtual storage; virtual networks, including virtual private networks; virtual applications and operating systems; and virtual clients.

In one example, management layer 64 may provide the functions described below. Resource provisioning provides dynamic procurement of computing resources and other resources that are utilized to perform tasks within the cloud computing environment. Metering and Pricing provide cost tracking as resources are utilized within the cloud computing environment, and billing or invoicing for consumption of these resources. In one example, these resources may comprise application software licenses. Security provides identity verification for cloud consumers and tasks, as well as protection for data and other resources, User portal provides access to the cloud computing environment for consumers and system administrators. Service level management provides cloud computing resource allocation and management such that required service levels are met. Service Level Agreement (SLA) planning and fulfillment provide pre-arrangement for, and procurement of, cloud computing resources for which a future requirement is anticipated in accordance with an SLA.

Workloads layer 66 provides examples of functionality for which the cloud computing environment may be utilized, Examples of workloads and functions which may be provided from this layer include: mapping and navigation; software development and lifecycle management; virtual classroom education delivery; data analytics processing; and transaction processing.

FIGS. 4A-4E are block diagrams illustrating an erasure code supported object storage architecture in which aspects of the illustrative embodiments may be implemented. A user 401 and database server 402 access application servers 403, 404. Based on requests from user 401 or database server 402, application servers 403, 404 send objects, such as object 480, to be stored to distributed storage system 490 via load balancer 405. In accordance with the illustrative embodiment, distributed storage system 490 is an erasure code supported object storage system that divides objects into slices and distributes the slices among storage nodes in geographically distributed storage sites.

In an erasure code supported object storage architecture, the received object to be stored is split into network chunks and each chunk is encoded with the erasure code (EC) schema. Each encoded chunk is referred to as a fragment or slice, and each slice is stored on different locations per node.

Thus, distributed storage system 490 ultimately stores objects written from application servers 403, 404 to storage sites 410, 420, 430. In geo-dispersed EC, storage sites 410, 420, 430 are geographically dispersed throughout a state or country, across multiple countries, or across multiple continents.

An Information Dispersal Algorithm (IDA) builds on the erasure code and goes one step further. The additional step of the IDA is to split the coded data into multiple segments, which can then be stored on different devices or media to attain a high degree of failure independence. For example, using erasure coding alone on files on a computer will not do much to help if the hard drive fails, but using an IDA to separate pieces across machines, you can now tolerate multiple failures without losing the ability to reassemble that data.

In accordance with the illustrative embodiment, the IDA splits the coded data into multiple slices (referred to as the "width" of the system). The distributed storage system 490 then distributes the slices to storage nodes across three different sites. Even though each site has experienced at least one device failure, the data is able to be reassembled bit-perfectly because only a subset of the slices (i.e., the "threshold" number of slices) is needed to recreate the data, thanks to the use of erasure coding. The width and threshold of a system are configurable and are determined by the reliability required. An organization can choose another configuration that allows for the loss of either more or fewer slices, depending on its need for storage system reliability.

The storage sites 410, 420, 430 include proxy servers 411, 421, 431, respectively. Proxy servers 411, 421, 431 transform objects into slices for writes (PUT operations) and transforms multiple slices into an object for reads (GET operations). Proxy servers 411, 421, 431 can be physical appliances, virtual appliances, or software packages. Thus, proxy servers 411, 421, 431 may execute on dedicated nodes at their respective storage sites 410, 420, 430. A physical proxy server may be based on commodity hardware and may include several models with varying capacity and performance.

The storage sites 410, 420, 430 also include storage servers 412, 422, 423, and 432. In the depicted example, each storage server is associated with a storage device 440, 450, 460, 470. Site 410 includes proxy server 411, storage server 412, and storage device 440. Storage servers 412, 422, 423, 432 store slices of objects. The number of storage servers is a multiple of the IDA width. Physical storage servers may be based on commodity hardware and may include several models with varying capacity and performance. As used herein, a pair of storage server 412 and storage device 440, for example, forms a storage node in site 1 410. In the depicted example, site 2 420 includes proxy server 421 and two storage nodes, the first storage node comprising storage server 422 and storage device 450 and the second storage node comprising storage server 423 and storage device 460. Site 3 430 includes proxy server 431 and one storage node comprising storage server 432 and storage device 470.

Each proxy server 411, 421, 431 can communicate with each storage server 412, 422, 423, 432 via a wide area network. In the depicted example, storage server 412 and storage device 440 are local to proxy server 411. Storage servers 422, 423 and storage devices 450, 460 are local to proxy server 421. Storage server 432 and storage device 470 are local to proxy server 431. In one embodiment, proxy server 411 and storage server 412 may execute on the same physical computing node. Alternatively, proxy server 411 and storage server 412 may be separate physical appliances executing on different physical computing nodes.

Geo-dispersed EC relies on reliable wide area network (WAN) connection. There are three key problems with current geo-dispersed erasure coding architectures and implementations: (1) object writes fail when network access is not reliable; (2) latency between geographically distributed sites or storage nodes results in lower performance of object writes; and, (3) read operations experience poor performance when network latency is high.

The illustrative embodiments provide a mechanism for hybrid EC storage that dynamically adapts to network conditions on both object writes and object reads. Using the three-site (node) example deployment architecture shown in FIG. 4A as an example, on object write (PUT operation), EC object service executes and all the slices are written to the disks on the local site, e.g., site 410 in the depicted example, where the PUT operation is initiated. For instance, application server 403 may initiate a PUT operation to write object 480 to distributed storage system 490, and load balancer 405 may select proxy server 411 in site 410 for serving the object request. Load balancer 405 may select the proxy server based on network delay, free resources, etc. More particularly, load balancer 405 may select proxy server 411 because proxy server 411 is geographically local to application server 403.

For example, assume Ohio (site 1 410), Tokyo (site 2 420), Mumbai (site 3 430) are three sites of object storage and each site can contain multiple storage nodes corresponding to object storage. Furthermore, each storage node may comprise multiple storage devices or disks. The erasure coding algorithm encodes the object, divides the object into multiple fragments, and sends the fragments among the three storage sites, where each slice may again be divided into multiple sub-slices, with each sub-slice being stored on a different storage node corresponding to object storage. The number of slices (including sub-slices) is determined based on the erasure code schema during initial system setup. Thus, if the initial request originates in Ohio (site 1 410), then Ohio is treated as the local site and proxy server 411 starts to perform the erasure coding/splitting.

Figure 4A:
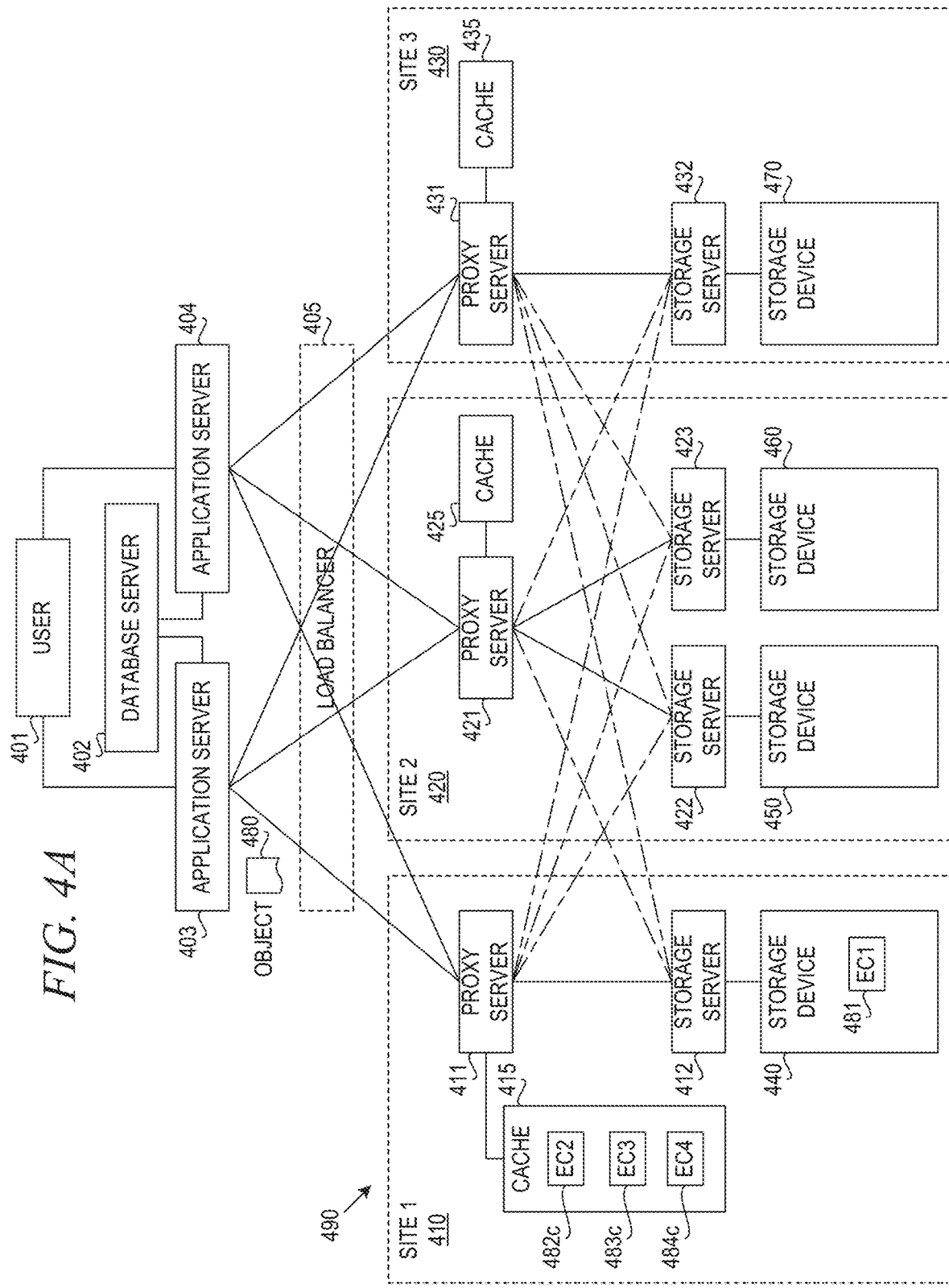

In other words, site 1 410 is geographically local to the application, e.g., application server 403, initiating the PUT operation. As shown in FIG. 4A, proxy server 411 stores slice EC1 481 in local storage device 440 as usual and stores cashed copies of slices EC2 482c, EC3 483c, and EC4 484c locally in a cache storage 415, Subsequently, geo-dispersal will disperse slices EC2 482, EC3 483, and EC4 484 to the other sites 420, 430; however, in the meantime, any read (GET operation) for object 480 will be served from the slices stored at site 1 410, including the slices in cache storage 415.

Figure 4B:
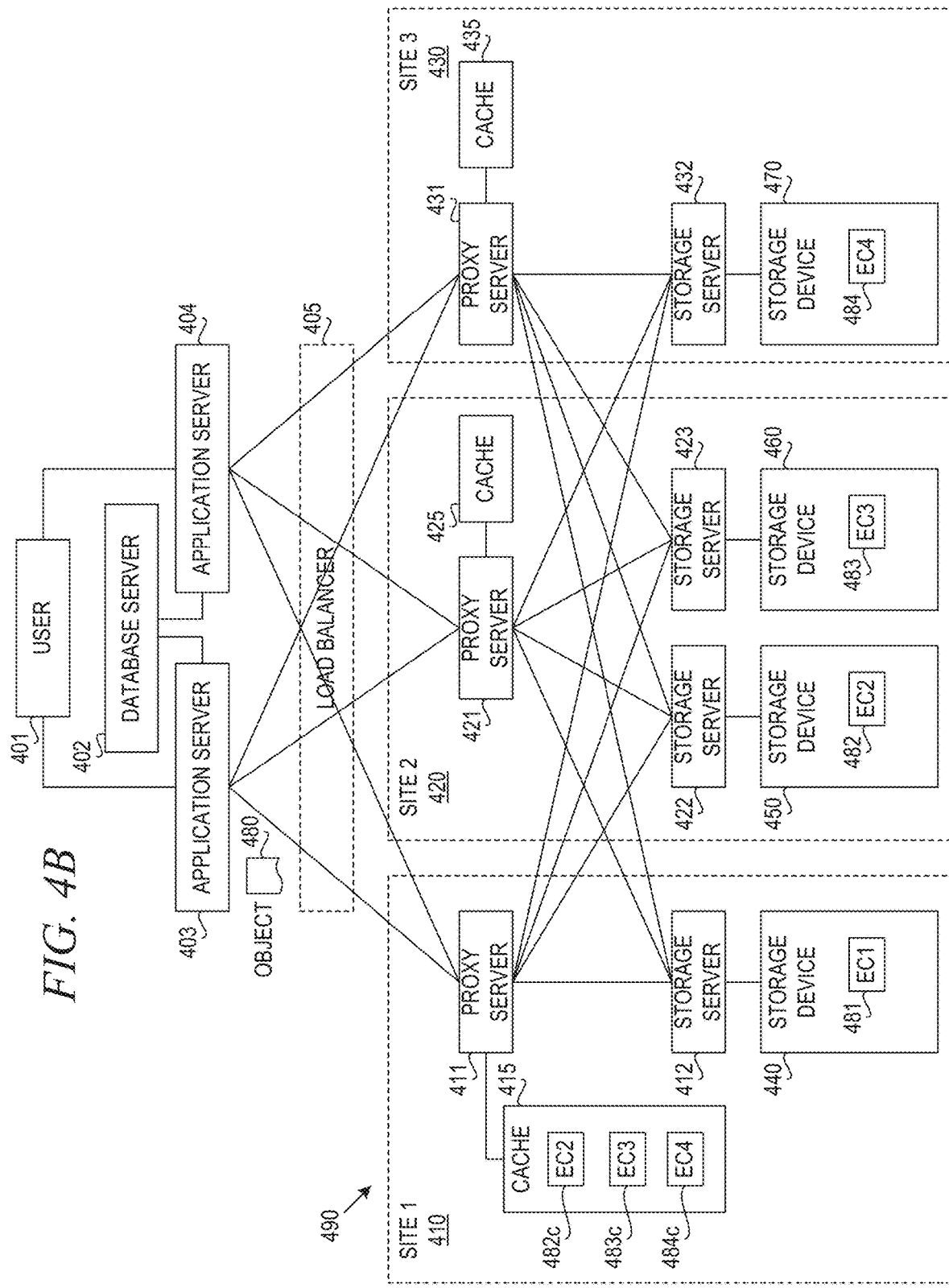

Turning to FIG. 4B, if the network is available, then proxy server 411 disperses slices EC2 482, EC3 483, and EC4 484 to the other sites 420, 430, resulting in slice EC2 482 being stored in storage device 450 by storage server 422, slice EC3 483 being stored in storage device 460 by storage server 423, and slice EC4 484 being stored in storage device 470 by storage server 432. If the network is available, then the dispersal of the slices will happen almost immediately. In one embodiment, EC object service 430 deletes duplicate slices EC2 482c, EC3 483c, and EC4 484c upon completion of dispersal of the slices 462, 463 to sites 420, 430.

File systems may support information lifecycle management (ILM) policies such that it is possible to monitor how frequently a file is accessed. A file's access temperature is an attribute for a policy that provides a means of optimizing tiered storage. File temperatures are a relative attribute, which indicates whether a file is "hotter" or "colder" than the others in its pool. The policy can be used to migrate hotter files to higher tiers and colder files to lower tiers. The access temperature is an exponential moving average of the accesses to the file. As files are accessed, the temperature increases; likewise, when the access stops, the file cools.

In one embodiment, duplicate slices EC2 482c, EC3 483c, EC4 484c may remain in cache 415. Thus, proxy server 411 may cache slices of object 480 on the local site 410, particularly for frequently accessed objects (i.e., hotter objects or files). Thus, in the example embodiment shown in FIG. 4B, proxy server 411 includes a mode for caching all fragments of the object on the local site 410. When serving a read request for the object 480, proxy server 411 uses the slices at site 410 to service the request without contacting the other sites 420, 430.

Even when there are temporary network outages, the frequently accessed (i.e, "hotter") objects will continue to be served from a single site. Also, in case of high network latency, performance of read operations may not be impacted as the objects are served from a single site. When the heat of the object reduces (i.e., less frequently accessed), the duplicate slices are deleted, and normal multi-site geo-dispersed erasure coding implementation is used. This ensures that storage efficiency is preserved for very frequently accessed objects.

Figure 4C:
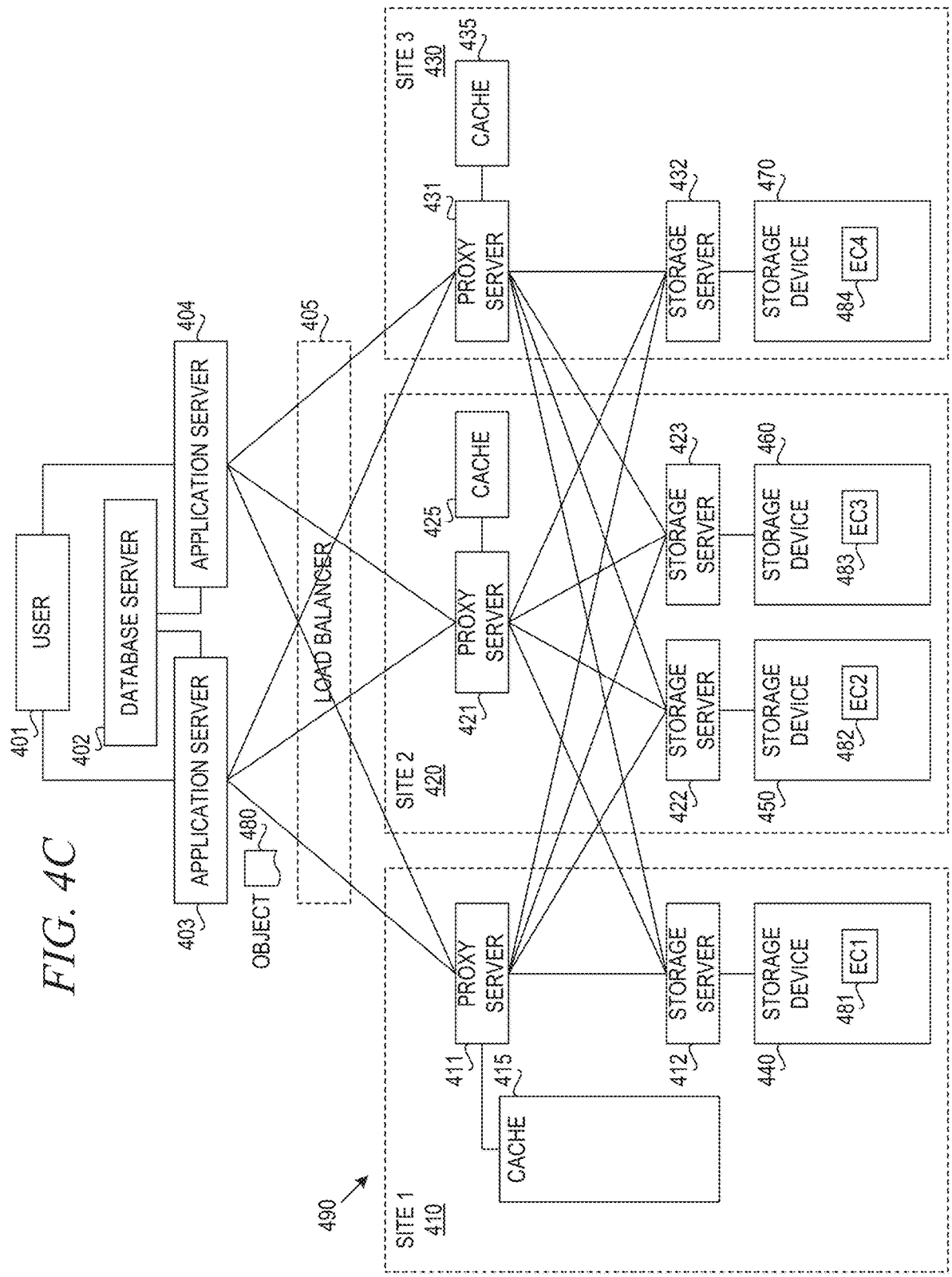

With reference now to FIG. 4C, after slices EC2 482, EC3 483, and EC4 484 are dispersed to sites 420, 430, proxy server 411 may delete the duplicate copies of the slices from cache 415. If a cache management mechanism is enabled to cache slices of hotter objects, proxy server 411 may delete the duplicate copies of the slices from cache 415 in response to the object becoming "cooler" or less frequently accessed. At this point, slices 481-484 are accessed using the non-hybrid geo-dispersed EC operation.

FIG. 4D illustrates an alternative embodiment of hybrid EC storage. In the depicted example, the WAN connection between proxy server 411 and storage server 432 in site 3 430 is acceptable, but the WAN connection between proxy server 411 and storage servers 422, 423 in site 2 420 is unacceptable. In this embodiment, proxy server 411 may store slice EC4 484 in storage device 470 via storage server 432 in site 3 430. Proxy server 411 may store slice EC1 481 in local storage device 440 via storage server and store duplicate slices EC2 482c and EC3 483c in local cache 415. Proxy server 411 may then serve a GET request by reading slice EC1 481 from storage device 440 via storage server 412, by reading cached slices EC2 482c and EC3 483c from local cache 415, and by reading slice EC4 484 from storage device 470 in site 3 430 via storage server 432, When the WAN connection to slite 2 420 recovers, then proxy server 411 may then disperse slices EC2, EC3 to storage servers 422, 423.

Figure 4E:
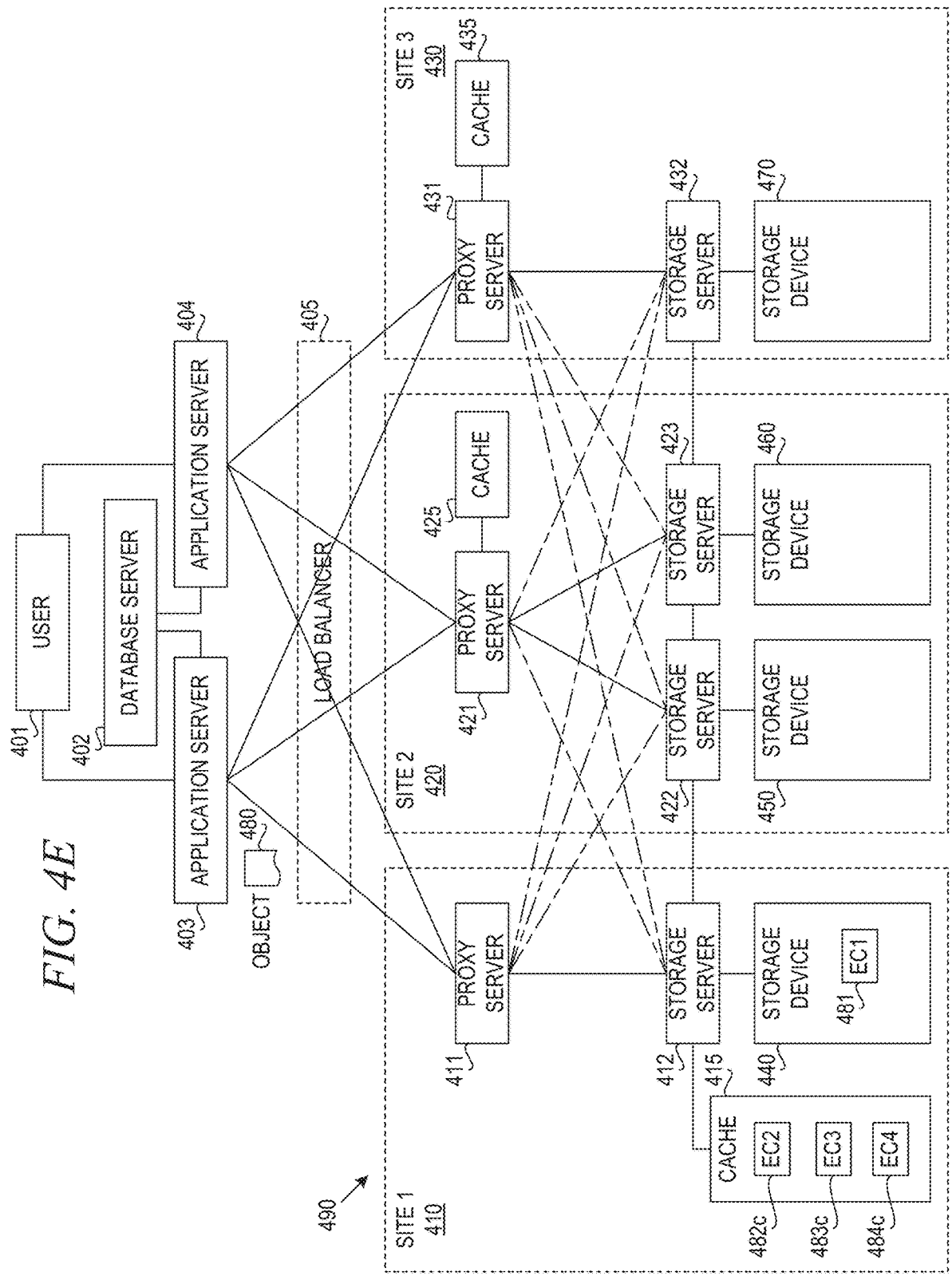

FIG. 4E illustrates an alternative embodiment in which cache 415 is associated with storage server 412. In the depicted example, storage servers 412, 422, 423, 432 may be connected via WAN connections. Proxy server 411 stores slice EC1 481 in local storage device 440 via storage server 412 and stores duplicate slices 482c, 483c, 484c in cache 415, When the WAN connections with sites 420, 430 improve, storage server 412 may then disperse slices EC2, EC3, EC4 to sites 420, 430.

Figure 5:
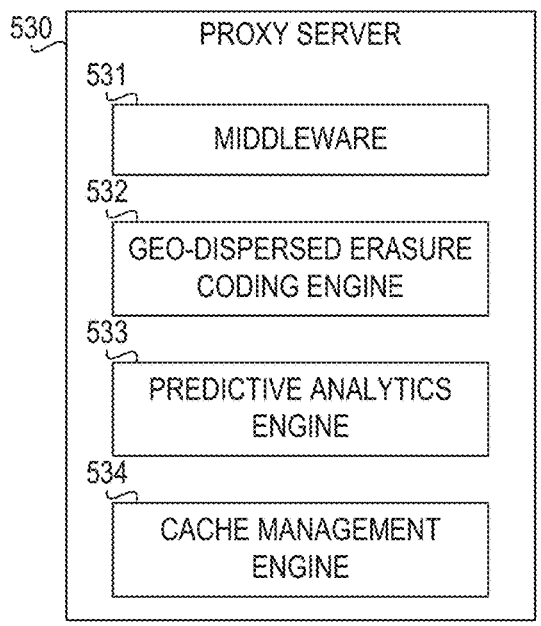
FIG. 5 is a block diagram illustrating a proxy server supporting hybrid geo-dispersed erasure coding in accordance with an illustrative embodiment.

FIG. 5 is a block diagram illustrating a proxy server supporting hybrid geo-dispersed erasure coding in accordance with an illustrative embodiment. Proxy server 530 comprises middleware 531, geo-dispersed erasure coding engine 532, predictive analytics engine 533, and cache management engine 534. Middleware 531 is a software component that helps in processing hypertext transport protocol (HTTP) headers (e.g., authentication, tokens, metadata, etc.).

Geo-dispersed EC engine 532 performs the operations of splitting an object into fragments and geographically dispersing the fragments when writing an object to multiple sites or nodes. In accordance with the illustrative embodiment, Geo-dispersed EC engine 532 also initially stores all fragments at a site that is local to the user or application performing the write (PUT operation). Subsequently, geo-dispersed EC engine 532 attempts to disperse the fragments from the local site or node to the remainder of the geographically dispersed sites.

In addition, geo-dispersed EC engine 532 performs the operations of gathering and combining fragments into an object when reading the object from storage and returning the object to the requesting user or application. If the fragments are stored locally, then geo-dispersed EC engine 532 reads the fragments from the local node, combines them to form the requested object, and returns the requested object. If the fragments are not stored locally, then the geo-dispersed EC engine 532 reads the fragments from multiple geographically dispersed sites, combines them to form the requested object, and returns the requested object.

Predictive analytics engine 533 collects historic averages of network performance metrics and analyzes the metrics continuously. The network performance metrics may include, for example, latency, throughput, time out, etc. Predictive analytics engine 533 uses predictive analytics to predict the network availability and to adjust retry logic accordingly. The predictive analytics may be used to predict whether the network access will be optimal for completing dispersal of the fragments to the multiple geographically distributed sites or nodes. Predictive analytics engine 533 may generate a binary decision about the quality of the network access or, alternatively, may generate a score for the network performance. A decision on whether to disperse fragments to the distributed sites may be made based on a comparison of the score to a threshold. A retry timer may be set to a time value based on results of the predictive analytics.

Cache management engine 534 performs operations to manage fragments stored locally at each site or node. Cache management engine 534 determines whether or when to delete cached fragments after the fragments have been dispersed to the plurality of geographically distributed sites. Cache management engine 534 may simply delete the cached copies of fragments in response to dispersal being completed. In one embodiment, cache management engine 534 may perform file or object access temperature based on how frequently and/or recently an object is accessed. Cache management engine 534 may then execute a replacement policy based on "hotness" (access frequency) of objects stored in the local cache storage. That is when a new object is stored locally, cache management engine 534 may select an object to be replaced based on hotness or some other metric.

FIG. 6 is a flowchart illustrating operation of a hybrid gee-dispersed erasure coding object service in accordance with an illustrative embodiment. Operation begins (block 600), and a user or application creates containers (block 601). The object service, executing within each proxy server, determines whether a hybrid model for erasure coding (EC) is enabled (block 602). If the hybrid model is not enabled, then the object service performs non-hybrid erasure coding geo-dispersal as normal (block 603). Thereafter, operation ends.

If the hybrid model is enabled in block 602, then the object service creates a local cache for EC fragments at each node (block 605). Thereafter, operation ends (block 604).

Figure 7:
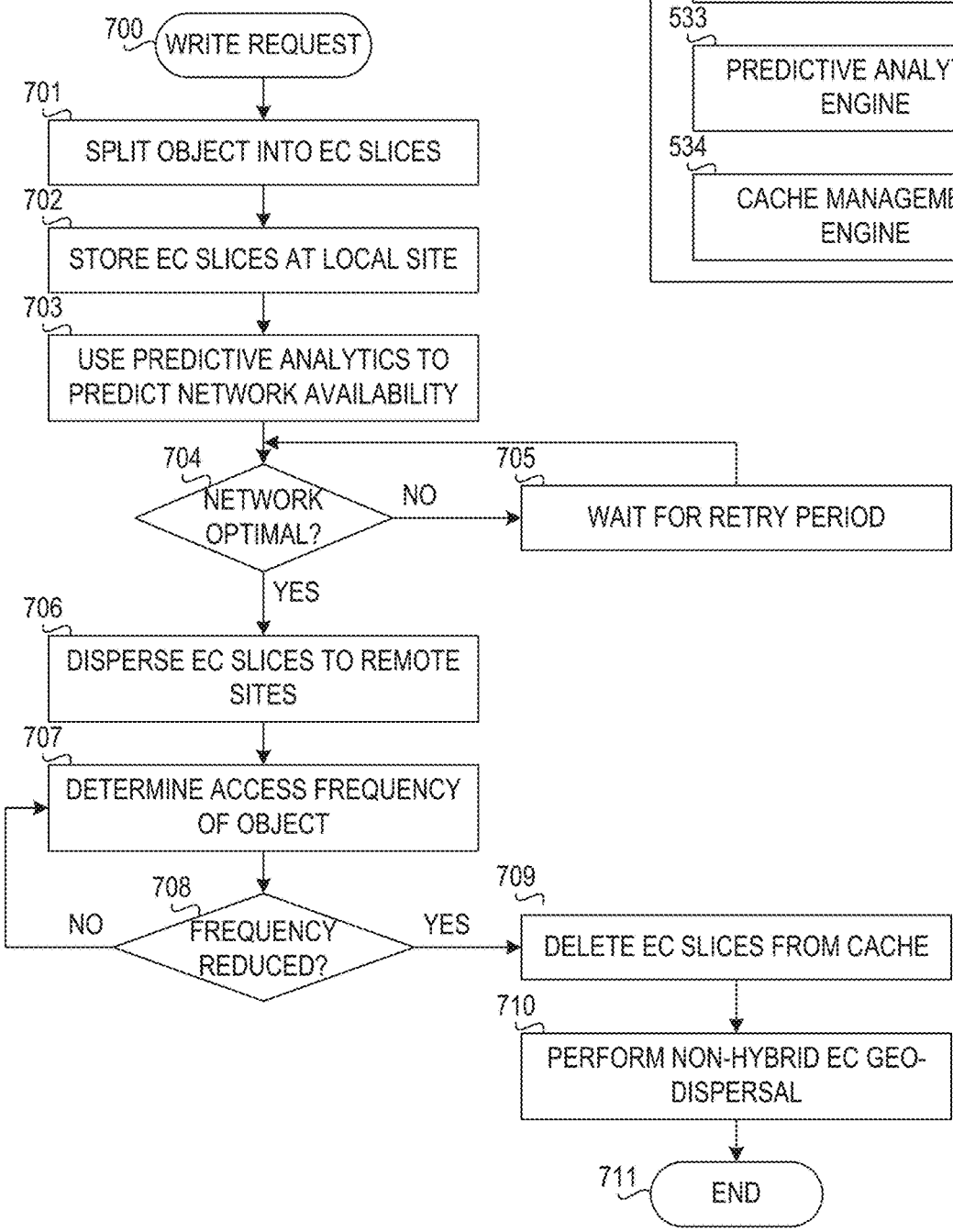
FIG. 7 is a flowchart illustrating operation of a hybrid geo-dispersed erasure coding object service for performing a write in accordance with an illustrative embodiment.

FIG. 7 is a flowchart illustrating operation of a hybrid geo-dispersed erasure coding object service for performing a write in accordance with an illustrative embodiment. Operation begins with receiving a write request (PUT operation) to write an object (block 700). The EC object service (e.g., geo-dispersed erasure coding engine 532 in FIG. 5) executes within each proxy server. When the write request is initiated, a load balancer component selects a local proxy server to which the object to be written is sent. The EC object service executing within the selected proxy server splits the object into a plurality of EC slices (block 701). The EC object service stores the EC slices at a local site (block 702). The EC object service may simply store all slices at the local storage node and keep track of which EC slices are designated to be geo-dispersed to the multiple nodes. Alternatively, the EC object service may store one EC fragment locally at a first storage node and store the remainder of the EC slices in a designated cache storage associated with the proxy server at the local site. At this point, reads may be serviced entirely from this local site.

The EC object service uses predictive analytics to predict network availability (block 703). Then, the EC object service determines whether the network is optimal for dispersal of the EC slices to the plurality of geographically distributed nodes (block 704). If the network is not optimal for geo-dispersal, then the EC object service waits for a retry period (block 705), and operation returns to block 704.

If the network is optimal for geo-dispersal in block 704, then the EC object service disperses the EC slices to the remote sites (block 706). At this point, reads may be serviced either entirely from the local site or from the plurality of geographically dispersed sites or nodes. The EC object service determines an access frequency (or "hotness") of the object (block 707). The EC object service determines whether the access frequency is reduced below a threshold value such that the duplicate EC slices should be deleted from or replaced within the cache storage at the local site (block 708). If the frequency is not reduced in block 708, then operation returns to block 707.

If the EC object service determines that the access frequency of the object is reduced in block 708, then the EC object service deletes the duplicate EC slices from the cache storage (block 709). The EC object service then performs non-hybrid EC geo-dispersal (block 710). Thereafter, operation ends (block 711).

FIG. 8 is a flowchart illustrating operation of a hybrid geo-dispersed erasure coding object service for performing a read in accordance with an illustrative embodiment. Operation begins with receiving a read request to read an object (block 800). The EC object service determines Whether all EC slices are at a site local to the invoking client (user or application) (block 801). If all EC slices are available locally, then the EC object service reads all slices from the local site (block 802) and combines the slices to form the requested object (block 803). The EC object service then returns the object to the invoking client (block 804), and operation ends (block 805).

If all EC slices are not available at a site or node local to the invoking client in block 801, then the EC object service reads the slices from multiple sites according to the geo-dispersed EC algorithm (block 806). The EC object service then combines the slices to form the object (block 803) and returns the object to the invoking client (block 804). Thereafter, operation ends (block 805).

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the users computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider), in some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart, or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a communication bus, such as a system bus, for example. The memory elements can include local memory employed during actual execution of the program code, bulk storage, and cache memories which provide temporary storage of at least some program code in order to reduce the number of times code must be retrieved from bulk storage during execution. The memory may be of various types including, but not limited to, ROM, PROM, EPROM, EEPROM, DRAM, SRAM, Flash memory, solid state memory, and the like.

Input/output or I/O devices (including but not limited to keyboards, displays, pointing devices, etc.) can be coupled to the system either directly or through intervening wired or wireless I/O interfaces and/or controllers, or the like. I/O devices may take many different forms other than conventional keyboards, displays, pointing devices, and the like, such as for example communication devices coupled through wired or wireless connections including, but not limited to, smart phones, tablet computers, touch screen devices, voice recognition devices, and the like. Any known or later developed I/O device is intended to be within the scope of the illustrative embodiments.

Network adapters may also be coupled to the system to enable the data processing system to become coupled to other data processing systems or remote printers or storage devices through intervening private or public networks. Modems, cable modems and Ethernet cards are just a few of the currently available types of network adapters for wired communications. Wireless communication based network adapters may also be utilized including, but not limited to, 802.11 a/b/g/n wireless communication adapters, Bluetooth wireless adapters, and the like. Any known or later developed network adapters are intended to be within the spirit and scope of the present invention.

The description of the present invention has been presented for purposes of illustration and description, and is not intended to be exhaustive or limited to the invention in the form disclosed. Many modifications and variations will be apparent to those of ordinary skill in the art without departing from the scope and spirit of the described embodiments. The embodiment was chosen and described in order to best explain the principles of the invention, the practical application, and to enable others of ordinary skill in the art to understand the invention for various embodiments with various modifications as are suited to the particular use contemplated. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, in a data processing system comprising at least one processor and at least one memory, the at least one memory comprising instructions which are executed by the at least one processor and configure the processor to implement a proxy server for hybrid geo-dispersed erasure coding (EC), the method comprising:

responsive to receiving from an application server a request to write an object, splitting, by the proxy server in a first storage site, the object into a plurality of EC slices, wherein the first storage site includes the proxy server, a separate first storage device, and a separate cache storage;

storing, by the proxy server, a first EC slice in a first storage device via the storage server;

storing, by the proxy server, a plurality of remaining EC slices in the cache storage, wherein the proxy server is configured to provide the plurality of remaining EC slices from the cache storage responsive to a read request while the plurality of remaining EC slices are stored in the cache storage;

responsive to storing the plurality of remaining EC slices in the cache storage, performing, by the proxy server, predictive analytics on historic averages of network performance metrics, wherein the proxy server determines whether a quality of network access is optimal for completing dispersal of the plurality of slices among a plurality of geographically distributed storage sites based on the predictive analytics; and responsive to the proxy server determining that the quality of network access is optimal, copying the plurality of remaining EC slices from the cache storage to the plurality of geographically distributed storage sites using geo-dispersed erasure coding, wherein the plurality of remaining EC slices remain in the cache storage at least until completion of the copying.

2. The method of claim 1, further comprising:
responsive to the proxy server determining that the quality of network access is not optimal, waiting for a predetermined retry period; and
responsive to expiration of the retry period, determining, by the proxy server whether the quality of network access is optimal for completing dispersal of the plurality of slices among a plurality of geographically distributed storage sites.

3. The method of claim 2, wherein the retry period is determined based on performing predictive analytics on historic averages of network performance metrics.

4. The method of claim 1, further comprising:
responsive to receiving a read request to read the object, reading the first EC slice from the first storage device and the plurality of remaining EC slices from the cache storage;
combining the first EC slice and the plurality of remaining EC slices to form the requested object; and
returning the requested object.

5. The method of claim 1, further comprising:
determining an access frequency for the object; and
responsive to the access frequency being reduced, deleting the plurality of remaining EC slices from the cache storage.

6. The method of claim 1, further comprising deleting the plurality of remaining EC slices from the cache storage responsive to the proxy server determining that copying of the plurality of remaining EC slices to the plurality of geographically distributed storage sites is completed.

7. The method of claim 1, wherein the historic averages of network performance metrics comprise at least one of latency, throughput, or time out.

8. The method of claim 1, further comprising:
responsive to receiving a read request to read the object, reading the plurality of EC slices from the plurality of storage sites;
combining the plurality of EC slices to form the requested object; and
returning the requested object.

9. The method of claim 1, wherein a load balancer component selects the proxy server based on the proxy server being local to the application server relative to other proxy servers in the plurality of geographically dispersed storage sites.

10. A computer program product comprising a computer readable storage medium having a computer readable program stored therein, wherein the computer readable program, when executed on a computing device, causes the computing device to implement a proxy server for hybrid geo-dispersed erasure coding (EC), wherein the computer readable program causes the computing device to:
responsive to receiving from an application server a request to write an object, split, by the proxy server in a first storage site, the object into a plurality of EC slices, wherein the first storage site includes the proxy server, a separate first storage device, and a separate cache storage;
store, by the proxy server, a first EC slice in a first storage device via the storage server;
store, by the proxy server, a plurality of remaining EC slices in the cache storage, wherein the proxy server is configured to provide the plurality of remaining EC slices from the cache storage responsive to a read request while the plurality of remaining EC slices are stored in the cache storage;
responsive to storing the plurality of remaining EC slices in the cache storage, perform, by the proxy server, predictive analytics on historic averages of network performance metrics, wherein the proxy server determines whether a quality of network access is optimal for completing dispersal of the plurality of slices among a plurality of geographically distributed storage sites based on the predictive analytics; and
responsive to the proxy server determining that the quality of network access is optimal, copy the plurality of remaining EC slices from the cache storage to the plurality of geographically distributed storage sites using geo-dispersed erasure coding, wherein the plurality of remaining EC slices remain in the cache storage at least until completion of the copying.

11. The computer program product of claim 10, wherein the computer readable program further causes the computing device to:
responsive to the proxy server determining that the quality of network access is not optimal, wait for a predetermined retry period; and
responsive to expiration of the retry period, determine, by the proxy server whether the network access is optimal for completing dispersal of the plurality of slices among a plurality of geographically distributed storage sites.

12. The computer program product of claim 11, wherein the retry period is determined based on performing predictive analytics on historic averages of network performance metrics.

13. The computer program product of claim 10, wherein the computer readable program further causes the computing device to:
responsive to receiving a read request to read the object, read the first EC slice from the first storage device and the plurality of remaining EC slices from the cache storage;
combine the first EC slice and the plurality of remaining EC slices to form the requested object; and
return the requested object.

14. The computer program product of claim 10, wherein the computer readable program further causes the computing device to:
   determine an access frequency for the object; and
   responsive to the access frequency being reduced, delete the plurality of remaining EC slices from the cache storage.

15. The computer program product of claim 10, wherein the computer readable program further causes the computing device to delete the plurality of remaining EC slices from the cache storage responsive to the proxy server determining that copying of the plurality of remaining EC slices to the plurality of geographically distributed storage sites is completed.

16. The computer program product of claim 10, wherein the historic averages of network performance metrics comprise at least one of latency, throughput, or time out.

17. The computer program product of claim 10, wherein the computer readable program further causes the computing device to:
   responsive to receiving a read request to read the object, read the plurality of EC slices from the plurality of storage sites;
   combine the plurality of EC slices to form the requested object; and
   return the requested object.

18. An apparatus comprising:
   at least one processor; and
   a memory coupled to the at least one processor, wherein the memory comprises instructions which, when executed by the at least one processor, cause the at least one processor to implement a proxy server for hybrid geo-dispersed erasure coding (EC), wherein the instructions cause the at least one processor to:
   responsive to receiving from an application server a request to write an object, split, by the proxy server in a first storage site, the object into a plurality of EC slices, wherein the first storage site includes the proxy server, a separate first storage device, and a separate cache storage;
   store, by the proxy server, a first EC slice in a first storage device via the storage server;
   store, by the proxy server, a plurality of remaining EC slices in the cache storage, wherein the proxy server is configured to provide the plurality of remaining EC slices from the cache storage responsive to a read request while the plurality of remaining EC slices are stored in the cache storage;
   responsive to storing the plurality of remaining EC slices in the cache storage, perform, by the proxy server, predictive analytics on historic averages of network performance metrics, wherein the proxy server determines whether a quality of network access is optimal for completing dispersal of the plurality of slices among a plurality of geographically distributed storage sites based on the predictive analytics; and
   responsive to the proxy server determining that the quality of network access is optimal, copy the plurality of remaining EC slices from the cache storage to the plurality of geographically distributed storage sites using geo-dispersed erasure coding, wherein the plurality of remaining EC slices remain in the cache storage at least until completion of the copying.

19. The apparatus of claim 18, wherein the instructions further cause the at least one processor to:
   determine an access frequency for the object; and
   responsive to the access frequency being reduced, delete the plurality of remaining EC slices from the cache storage.

20. The apparatus of claim 18, wherein the instructions further cause the at least one processor to delete the plurality of remaining EC slices from the cache storage responsive to the proxy server determining that copying of the plurality of remaining EC slices to the plurality of geographically distributed storage sites is completed.

* * * * *